United States Patent [19]

Takechi et al.

[11] Patent Number: 5,333,087
[45] Date of Patent: Jul. 26, 1994

[54] SUPERCONDUCTING MAGNET APPARATUS WITH A MAGNETIC SHIELD

[75] Inventors: Moriaki Takechi; Tatsuya Oue, both of Ako, Japan

[73] Assignee: Mitsubishi Denki Kabushiki Kaisha, Tokyo, Japan

[21] Appl. No.: 80,099

[22] Filed: Jun. 23, 1993

Related U.S. Application Data

[63] Continuation of Ser. No. 747,586, Aug. 20, 1991, abandoned.

[30] Foreign Application Priority Data

Aug. 24, 1990 [JP] Japan ................... 2-223091

[51] Int. Cl.$^5$ ............................................. H01F 7/22
[52] U.S. Cl. ......................................... 361/19; 361/140; 361/141
[58] Field of Search ........................... 361/19, 140, 141

[56] References Cited

U.S. PATENT DOCUMENTS 4,680,666  7/1987  Rios ........................... 361/141
4,689,707  8/1987  Schwall ....................... 361/19

FOREIGN PATENT DOCUMENTS 144171   12/1985  European Pat. Off. ....... H01F 7/22
1226597   5/1968  United Kingdom ........... H01F 7/22
1120977   7/1968  United Kingdom ........... H01F 7/20
2229862   3/1990  United Kingdom ........... H01F 7/22

OTHER PUBLICATIONS

Sughrue, Mion, Zinn, Macpeak & Seas

Primary Examiner—Jeffrey A. Gaffin
Assistant Examiner—S. Jackson
Attorney, Agent, or Firm—Sughure, Mion, Zinn, Macpeak & Seas

[57] ABSTRACT

A superconducting magnet apparatus has two or more divided superconducting coils successively arrayed in series and a magnetic shield. The divided superconducting coils arrayed in the axial direction are successively electrically connected in series, and protective diodes are connected between two connection points symmetrically-located with respect to the center of the serially-connected superconducting coil array as a reference.

5 Claims, 2 Drawing Sheets

SUPERCONDUCTING MAGNET APPARATUS WITH A MAGNETIC SHIELD

This is a continuation of application No. 07/747,586 filed Aug. 20, 1991, now abandoned.

BACKGROUND OF THE INVENTION

1. Field of the Invention

The present invention relates to a superconducting magnet with a magnetic shield for generating a highly uniform magnetic field for use in a magnetic resonance diagnosis apparatus.

2. Description of the Related Art

In magnets for a magnetic resonance diagnosis apparatus, a high-intensity uniform magnetic field must be generated in an image-photographing space of an opening of the magnet. A conventional magnet presents a problem in that, when such a magnetic field is generated, the magnetic field leaks to the outside and exerts a bad influence on peripheral devices. Therefore, magnetic coils are enclosed by a ferromagnetic substance so as to shut off magnetic fields.

FIG. 2 is a cross-sectional view showing a magnet with a magnetic shield disclosed in, for example, Japanese Patent Laid-Open No. 63-281410. In FIG. 2, a superconducting field coil 1 wound around a reel (not shown) is housed in a cryostat 2. A magnetic shield 3 provided in such a manner as to enclose the cryostat 2 comprises a cylindrical yoke 4 and an end plate 5 having a central opening 6.

Since electromagnets for a magnetic resonance diagnosis apparatus are required to generate a highly uniform static magnetic field, the field coil 1 is usually composed of two or more divided coils and the arrangement thereof is determined in such a way that a highly uniform magnetic field can be obtained by taking the magnetic shield 3 into account. The field coil 1 and the magnetic shield 3 are arranged in such a manner so as to be positioned symmetrically with respect to the axial direction of the coil, because if they are unsymmetric with respect to the center O of the coil and the axial direction X of the coil, a gradient magnetic field is generated and the uniformity of the magnetic field decreases.

FIG. 3 is a cross-sectional view showing the placement of the coils of a superconducting magnet, for example, separated into six sections. The field coil 1 comprises end-section superconducting coils 7a and 7f, intermediate-section superconducting coils 7b and 7e, and central-section superconducting coils 7c and 7d. These superconducting coils 7a, 7b, 7c, 7d, 7e, and 7f are wound in a state in which they are placed in series. Next, an example of the connection of a conventional superconducting magnet apparatus is shown in FIG. 4. In FIG. 4, superconducting coils 7a, 7b, 7c, 7d, 7e, and 7f are successively wound in series. Protective diodes 8a, 8b, 8c, 8d, 8e, and 8f are respectively connected in parallel to these superconducting coils, as shown in FIG. 4. A persistent current switch 9 is connected between both ends of these serially-connected six superconducting coils, forming a closed circuit.

In such a superconducting magnet formed as described above, a current in the circuit circulates through the closed circuit passing through the persistent current switch 9 through the superconducting coils 7a, 7b, 7c, 7d, 7e, and 7f, and thus a persistent current condition is maintained. In such a state, no current flows through the superconducting coil protective diodes 8a, 8b, 8c, 8d, 8e, and 8f. The superconducting coils 7a, 7b, 7c, 7d, 7e, and 7f and the magnetic shield 3 are positioned symmetrically with each other, and no non-equilibrium electromagnetic force will be generated.

On the other hand, in superconducting magnets, a transition to a normal conducting state sometimes occurs in superconducting coils which is caused by thermal or electromagnetic disturbance applied to the superconducting coils. If a transition to a normal conducting state occurs, electrical resistance appears inside the superconducting coils and the current attenuates rapidly. At this time, a voltage generated by the electrical resistance and an inductance voltage induced by the attenuation of the current are generated in the coil in which a transition to a normal conducting state transition has been generated. A voltage caused by the current attenuation is also induced in coils in which no normal conduction transition has occurred. When the voltage generated due to these normal conduction transitions exceeds a turn-on voltage of protective diodes 8a, 8b, 8c, 8d, 8e, and 8f, the diodes are turned on, causing both ends of the superconducting coils to be shorted. This short-circuit enables a voltage generated in the superconducting coils to be suppressed, thereby preventing insulation breakdown.

For example, a case in which the end-section superconducting coil 7a makes a transition to a normal conducting state in FIG. 4 will be considered. Electrical resistance appears in the superconducting coil 7a and the current in the superconducting coil 7a attenuates rapidly. However, a current which circulates through the superconducting coils 7b, 7c, 7d, 7e, and 7f flows through the circuit passing through the persistent current switch 9 after passing through the protective element 8a. The current is hardly attenuated because the resistance inside the circuit is small, but on the contrary the current attenuation sometimes increases due to the induction by changes in the current of the superconducting coil 7a. Therefore, the current flowing through the superconducting coil 7a becomes smaller than the current flowing through superconducting coils 7b, 7c, 7d, 7e, and 7f if a transition to a normal conducting state occurs in the superconducting coil 7a. Consequently, the axial current distribution of the superconducting coil group becomes asymmetric with respect to the center of the magnetic shield. As a result, a non-equilibrium electromagnetic force is generated between the superconducting coils 7b, 7c, 7d, 7e, and 7f and the magnetic shield 3. Hence, a superconducting coil support construction (not shown) must have a strength which can withstand this non-equilibrium electromagnetic force. As a consequence, there arises a problem in that the apparatus is complex in construction and expensive.

As a method for preventing such a non-equilibrium electromagnetic force, the connection of FIG. 5 is used in the prior art. That is, among separately placed superconducting coils, superconducting coils 7a and 7f, 7b and 7e, and 7c and 7d, which are positioned symmetrically to each other, are connected in series, forming coil pairs. These superconducting coil pairs are each connected in series, and pairs of protective diodes 10a, 10b, and 10c are connected in parallel between both ends of each of the above-described superconducting coil pairs respectively, as shown. In this connection, even when a transition to a normal conducting state occurs in any one of the superconducting coils and protective diodes are turned on, since a coil pair in which two superconducting coils positioned in symmetry are connected in series are shorted by corresponding protective diodes, the currents of the superconducting coils positioned symmetrically are equal to each other and no equilibrium electromagnetic force will be generated. However, this method has drawbacks in that lead wires for connecting the coils are long because superconducting coils successively connected in series are spaced apart as coils positioned spatially symmetrically must be connected in series, and therefore, the wiring is intertwined and complex and the characteristics are liable to be unstable.

SUMMARY OF THE INVENTION

The present invention has been devised to solve the above-mentioned problems of the prior art. Accordingly, an object of the present invention is to obtain a superconducting magnet apparatus having two or more divided superconducting coils and a magnetic shield, such that when any one of the superconducting coils makes a transition to a normal conducting state, no non-equilibrium electromagnetic force will be generated and wiring can be performed easily.

In the superconducting magnet apparatus of the present invention, two or more superconducting coils arranged successively in series are connected successively in a spatial array order, and a protective circuit including a pair of protective diodes connected reversely in parallel is connected between each pair of symmetric connection points between the coils.

In the superconducting magnet apparatus of the present invention, since a protective circuit is connected between each pair of symmetric connection points of the connection points of a plurality of superconducting coils successively connected in series, even if a transition to a normal conducting state occurs in any one of the divided coils, a current which flows the superconducting coils arranged symmetrically is equal at all times, and a non-equilibrium electromagnetic force will not be generated. Also, since the divided superconducting coils are connected in a spatial array order, coils connected in series are adjacent to each other. Therefore, drawbacks in that the connection lead among coils is long and complex in construction, and of characteristics becoming unstable as in the prior art, can be eliminated.

DESCRIPTION OF THE PREFERRED EMBODIMENT

Figure 2:
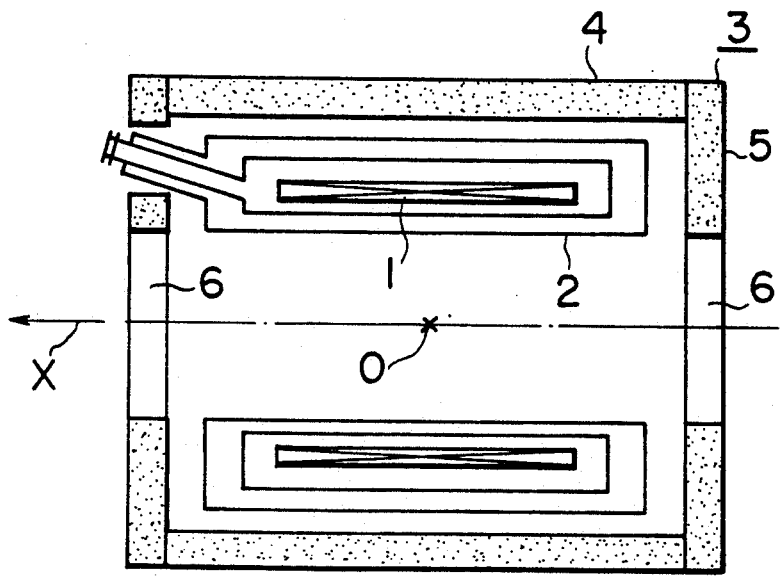
FIG. 2 is a cross-sectional view showing the construction of a superconducting magnet with a magnetic shield.
Figure 3:
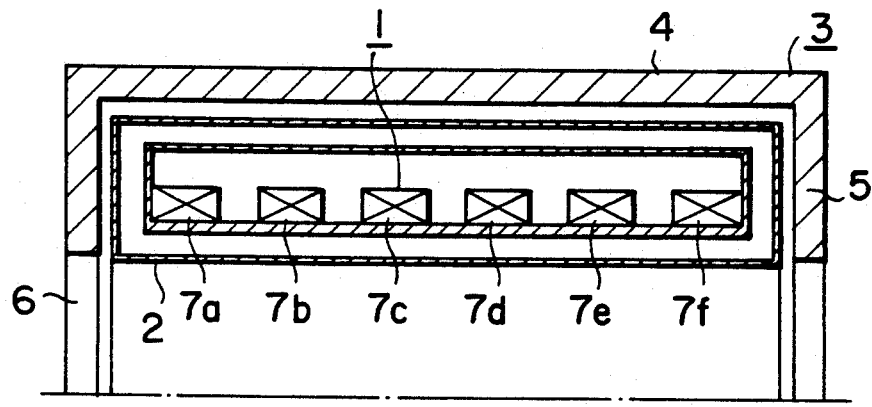
FIG. 3 is a cross-sectional view showing the placement of the coils of a field coil.
Figure 4:
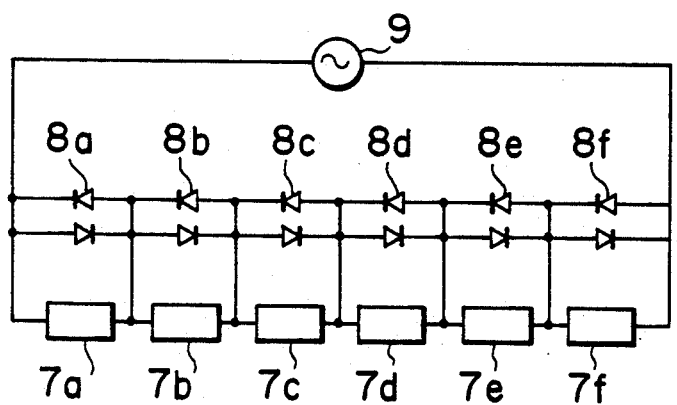
FIGS. 4 and 5 are connection diagrams showing the coil connection of a conventional superconducting magnet apparatus.
Figure 5:
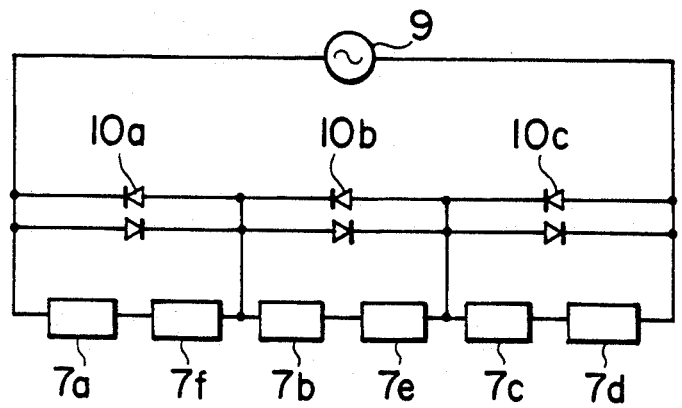

An embodiment of the present invention will be explained below with reference to the accompanying drawings. In the superconducting magnet apparatus with a magnetic shield of the present invention, construction of a superconducting field coil, a cryostat and a magnetic shield, and further an arrangement of the divided coils of the field coil are the same as those shown in FIGS. 2 and 3, respectively. Therefore, an illustration and explanation thereof are omitted.

Figure 1:
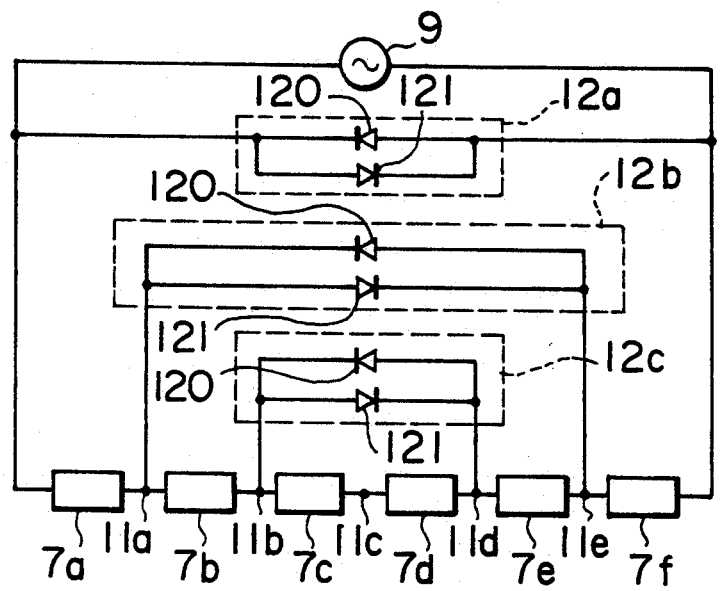
FIG. 1 is a connection diagram showing an embodiment of a superconducting magnet apparatus of the present invention.

FIG. 1 is a connection diagram showing an embodiment of a superconducting magnet apparatus of the present invention. In FIG. 1, six divided superconducting coils 7a, 7b, 7c, 7d, 7e, and 7f which form a superconducting field coil 1 are successively connected in series in a spatial array order, i.e., in the order of 7a, 7b, 7c, 7d, 7e and 7f. Protective circuits 12b and 12c are connected between two connection points which are symmetric with each other with respect to the center of the field coil 1, i.e., between a connection point 11a and a connection point 11e, and between a connection point 11b and a connection point 11d, respectively. The protective circuit 12a and a persistent current switch 9 are connected between both ends of the above serially-connected coil group so as to form a closed circuit. Each of protective circuits 12a, 12b, and 12c is provided with two protective diodes 120 and 121 connected in parallel with reverse polarity.

Next, the operation of the magnet shown in FIG. 1 will be explained. In a normal state, the current flows in the circuit of the superconducting magnet so as to circulate a closed circuit passing through the persistent current switch 9 through the superconducting divided coils 7b, 7c, 7d, 7e, and 7f, and thus a persistent current condition is maintained.

Next, a case in which a transition to a normal conducting state occurs in the superconducting coil 7a of the superconducting magnet apparatus will be considered. The current of the end-section coil 7a decreases rapidly due to resistance appeared in the coil 7a. At the same time, however, resistance voltage caused by the resistance and induced voltage caused by changes of the current are generated across the protective circuit 12b from one end to another. When the voltage across terminals 11a and 11e exceeds a turn-on voltage of the protective diodes 120 and 121 of the protective circuit 12b, the protective circuit 12b is turned on, causing connection points 11a and 11e to be shorted by low resistance. This short-circuit enables a voltage generated in the superconducting coils to be suppressed, thereby protecting them against an over-voltage.

On the other hand, a current equal to that of the coil 7a flows through the coil 7f positioned symmetrically with the coil 7a in which a transition to a normal conducting state has occurred, because of the symmetry of the circuit. Likewise, the current of the superconducting coil 7b is equal to that of the coil 7e; the current of the superconducting coil 7c is equal to that of the coil 7d.

As described above, since the currents of the superconducting divided coils positioned symmetrically are equal to each other at all times in any condition and the electromagnetic forces which act between the superconducting series-connected coils 7a, 7f, 7b, 7e, 7c, and 7d and the magnetic shield 3 are symmetric, a non-equilibrium electromagnetic force is not exerted upon the superconducting series coils and the magnetic shield. Thus, the support structure (not shown) can be simplified.

Although, in the above-described embodiment, a coil structure divided into six parts was explained, a similar effect can be obtained by a wiring arrangement similar to that in the above-described embodiment even with 3, 4, 5 or 7 or more separations.

As has been explained above, according to the present invention, since, in a superconducting magnet apparatus with a magnetic shield having two or more divided superconducting coils and a magnetic shield, superconducting coils and protective circuits are connected in such a way that the currents of superconducting coils positioned symmetrically with each other are equal to each other, no non-equilibrium electromagnetic force is exerted between the superconducting coils and the magnetic shield even when normal conduction transition occurs in any one of the superconducting coils. Thus, there is an advantage in that a highly stable superconducting magnet apparatus can be obtained.

Also, according to the present invention, since the divided superconducting coils are connected in a spatial array order, coils connected in series are adjacent to each other. Therefore, drawbacks in that the connection lead among coils are respectively long and complex in construction, and of characteristics becoming unstable as in the prior art, can be eliminated.

What is claimed is:

1. A superconducting magnet apparatus with a magnetic shield comprising:

a superconducting field coil divided into two or more superconducting coils which are connected in series and arranged sequentially, said superconducting coils forming symmetric pairs such that the superconducting coils corresponding to respective symmetric pairs are positioned on opposite sides of a center point of said superconducting field coil at equal distances from said center point, said superconducting field coil further including connection points disposed between each of said superconducting coils;

a permanent current switch connected between both ends of said superconducting field coil;

a plurality of protective circuits connected respectively between both ends of the superconducting field coil and between each pair of the connection points positioned symmetrically with respect to said center of the superconducting field coil such that said superconducting coils are arranged in symmetrical pairs with respect to the center of the superconducting field coil when connected to said protective circuits, each of said protective circuits having a predetermined turn-on voltage for protecting the superconducting coils against an overvoltage;

a cryostat for housing said superconducting coil; and a magnetic shield for enclosing said cryostat.

2. The superconducting magnet apparatus with a magnetic shield according to claim 1 wherein each of said protective circuits is composed of two protective diodes connected in parallel with reverse polarity and each having said predetermined turn-on voltage.

3. The superconducting magnet apparatus with a magnetic shield according to claim 1 wherein said predetermined turn-on voltage is not more than a permissible voltage of the superconducting coils.

4. The superconducting magnet apparatus with a magnetic shield according to claim 1, wherein said superconducting field coil is divided into an even number of two or more divided superconducting coils.

5. The superconducting magnet apparatus with a magnetic shield according to claim 1, wherein said superconducting field coil is divided into an odd number of three or more divided superconducting coils.

* * * * *